United States Patent [19]

Wurzburg

[11] Patent Number: 4,585,951

[45] Date of Patent: Apr. 29, 1986

[54] PRECISION TRIANGLE WAVEFORM GENERATOR

[75] Inventor: Henry Wurzburg, Round Rock, Tex.

[73] Assignee: Motorola, Inc., Schaumburg, Ill.

[21] Appl. No.: 544,670

[22] Filed: Oct. 24, 1983

[51] Int. Cl.$^4$ .............................................. H03K 4/48
[52] U.S. Cl. ..................................... 307/228; 307/246;
307/264; 307/353; 307/359; 307/579; 328/61;
328/127; 328/181; 328/185
[58] Field of Search ............... 307/228, 490, 491, 494,
307/496, 497, 351–353, 358–359, 362, 240, 243,
246, 577, 579, 584, 585, 263, 264; 328/35, 61,
127, 181, 183–185

[56] References Cited

U.S. PATENT DOCUMENTS

| 3,859,603 | 1/1975 | Herzner | 307/228 X |
|---|---|---|---|
| 3,894,224 | 7/1975 | Korteling | 307/496 X |
| 3,914,623 | 10/1975 | Clancy | 307/263 X |
| 4,449,059 | 5/1984 | Dickes | 307/228 |
| 4,506,169 | 3/1985 | Cole | 307/351 |
| 4,516,038 | 5/1985 | Glennon | 328/181 X |
| 4,525,334 | 6/1985 | Brajder et al. | 307/228 X |

FOREIGN PATENT DOCUMENTS 0144650  12/1978  Japan .................................. 328/181

OTHER PUBLICATIONS

Cutler, "Versatile Waveform Generator Circuit", Electronic Engineering, Nov. 1976, pp. 27–28.
Tiponut et al., "Generating Triangular Waves in Accurate, Adjustable Shapes", Electronics, Mar. 1982, pp. 129–131.

*Primary Examiner*—Stanley D. Miller
*Assistant Examiner*—D. R. Hudspeth
*Attorney, Agent, or Firm*—Anthony J. Sarli, Jr.; Jeffrey Van Myers; Robert L. King

[57] ABSTRACT

A triangle waveform generator having precise edges is provided. A switched voltage controlled current source portion is coupled to an integrator circuit for providing the triangular output waveform. A switched capacitor integrator portion accurately controls the switched current source portion in response to both a reference voltage and the output voltage.

12 Claims, 5 Drawing Figures

PRECISION TRIANGLE WAVEFORM GENERATOR

TECHNICAL FIELD

This invention relates generally to function generator circuits and, more particularly, to triangle waveform generator circuits having a precise waveform.

BACKGROUND ART

There are various forms of triangle waveform generator circuits. One well known triangular generator utilizes two switched current sources connected to an integrator wherein the accuracy of the output signal is dependent in large part upon the preciseness of the current sources and an integrating capacitor. Precision current sources typically require a precise resistor which converts an accurate reference voltage. Such a precise resistor is difficult to implement on an integrated circuit and often necessitates large circuit area or the use of an external resistor. Further disadvantages include the necessity for a precise capacitor for use in conjunction with the integrator. Since capacitors having precise values are difficult to implement in integrated circuit form, a capacitor which is external to the integrated circuit is often required. Other function circuits which implement capacitors integrated onto a single circuit typically require capacitor trimming to obtain precision. In addition, offset voltage associated with operational amplifier integrators may be another source of inaccuracy.

SUMMARY OF THE INVENTION

It is an object of the present invention to provide an improved precision triangle waveform generator.

Another object of the present invention is to provide an improved triangle waveform generator in integrated circuit form requiring no components external to the integrated circuit.

In carrying out the above and other objects of the present invention, there is provided, in one form, a precision triangle waveform generator for providing a triangular output signal of predetermined frequency having precise valued peaks. Switched voltage controlled current source means are provided for alternately sourcing and sinking a current to an input of an integrating amplifier. Control means are coupled to the switched current source means for controlling the switched current source in response to both a reference voltage and the peak values of the output signal. The peak values of the output waveform are compared with positive and negative values of the reference voltage. Any difference between the compared voltages results in compensating the output voltage via the switched current source means so that the positive and negative peak values of the triangular outputs equal the positive and negative values of the reference voltage, respectively. The current source means and the control means are switched by switches controlled by a control signal having the predetermined frequency which is the resulting frequency of the output voltage.

The above and other objects, features and advantages of the present invention will be best understood from the following detailed description taken in conjunction with the following drawings.

DETAILED DESCRIPTION OF THE PRESENT INVENTION

Figure 1:
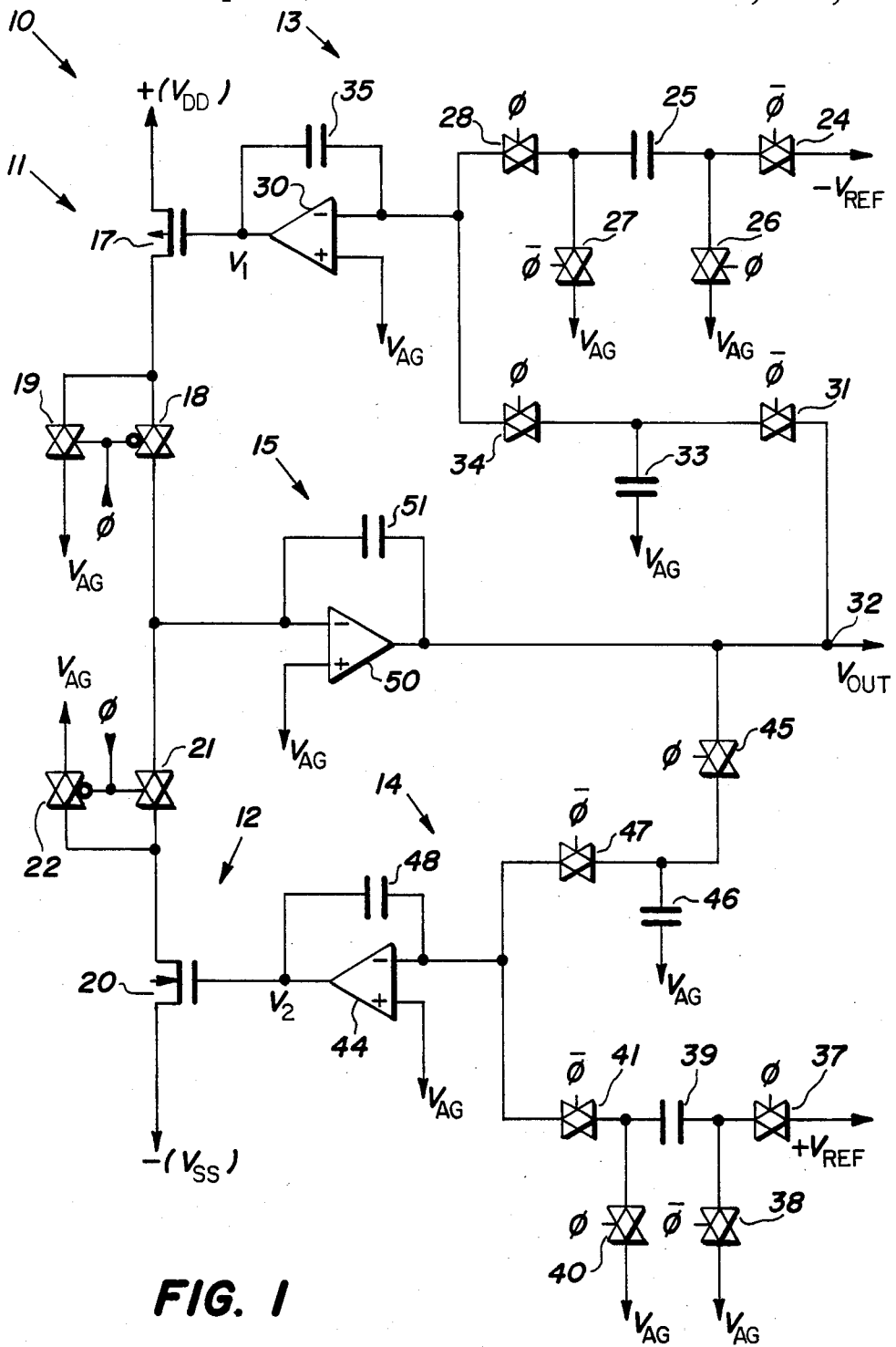
FIG. 1 illustrates in schematic form a triangle waveform generator in accordance with the present invention.

Shown in FIG. 1 is a triangle waveform generator circuit 10 having a first voltage controlled current source 11, a second voltage controlled current source 12, a first control portion 13, a second control portion 14 and an integrator portion 15. While specific N-channel and P-channel MOS devices are shown, it should be clear that triangle waveform generator circuit 10 could be implemented by completely reversing the processing techniques (e.g. P-channel to N-channel) or by using other types of transistors. In the preferred embodiment, all switches are implemented as CMOS transmission gates which are clocked in a conventional manner.

First voltage controlled current source 11 comprises a P-channel MOS transistor 17 having a source connected to a terminal for receiving a positive supply voltage, say $V_{DD}$. Transistor 17 has a gate for receiving a first control voltage, $V_1$, and a drain. A switch 18 has a first terminal connected to both a first terminal of a switch 19 and the drain of transistor 17. A second terminal of switch 19 is connected to a reference voltage, such as analog ground $V_{AG}$. Switch 19 has a control electrode of N conductivity type connected to both a control electrode of P conductivity type of switch 18 and a clock control signal $\phi$ shown in FIG. 2(a).

Second voltage controlled current source 12 comprises an N-channel MOS transistor 20 having a source connected to a terminal for receiving a negative supply voltage, say $V_{SS}$. Transistor 20 has a gate for receiving a second control voltage, $V_2$, and a drain. A switch 21 has a first terminal connected to the drain of transistor 20 and a second terminal connected to a second terminal of switch 18. A first terminal of a switch 22 is connected to the first terminal of switch 21, and a second terminal of switch 22 is connected to a terminal for receiving reference voltage $V_{AG}$. Control signal $\phi$ is connected to both a P conductivity type control electrode of switch 22 and an N conductivity type control electrode of switch 21.

First control portion 13 comprises a switch 24 having a first terminal connected to a negative reference voltage ($-V_{REF}$) and a second terminal connected to both a first electrode of a capacitor 25 and a first terminal of a switch 26. An N conductivity type control electrode of switch 24 is connected to a control signal $\bar{\phi}$ which is an underlapped complement of control signal $\phi$. A second terminal of switch 26 is connected to reference voltage $V_{AG}$. A second electrode of capacitor 25 is connected to both a first terminal of a switch 27 and a first terminal of a switch 28. A second terminal of switch 27 is connected to reference voltage $V_{AG}$, and a second terminal of switch 28 is connected to a negative or inverting input of an operational amplifier 30. An N conductivity type control electrode of switches 26 and 28 are each connected to control signal $\phi$, and an N conductivity type control electrode of switch 27 is connected to control signal $\bar{\phi}$. A positive or noninverting input of operational amplifier 30 is connected to reference voltage $V_{AG}$. A first terminal of a switch 31 is connected to an output terminal 32 for providing an output voltage $V_{OUT}$. A second terminal of switch 31 is connected to both a first electrode of a capacitor 33 and a first terminal of a switch 34. Capacitor 33 also has a second electrode connected to reference voltage $V_{AG}$. A second electrode of switch 34 is connected to the negative input of operational amplifier 30. Switches 31 and 34 have an N conductivity type control electrode connected to control signals $\bar{\phi}$ and $\phi$, respectively. An integrating feedback capacitor 35 has a first electrode connected to the negative input of operational amplifier 30 and a second electrode connected to both the output of operational amplifier 30 and the gate of transistor 17. In the illustrated form, switches 26, 28 and 34 are made conductive by control signal $\phi$ being at a high logic level, and switches 24, 27 and 31 are made conductive by control signal $\bar{\phi}$ being at a high logic level.

Second control portion 14 comprises a switch 37 having a first terminal connected to a positive voltage reference ($+V_{REF}$). A second terminal of switch 37 is connected to both a first terminal of a switch 38 and a first electrode of a capacitor 39. A second terminal of switch 38 is connected to reference voltage $V_{AG}$. A second electrode of capacitor 39 is connected to both a first terminal of a switch 40 and a first terminal of a switch 41. A second terminal of switch 40 is connected to reference voltage $V_{AG}$, and a second terminal of switch 41 is connected to a negative or inverting input of an operational amplifier 44. A switch 45 has a first terminal connected to output terminal 32 and a second terminal connected to both a first electrode of a capacitor 46 and a first terminal of a switch 47. A second electrode of capacitor 46 is connected to reference voltage $V_{AG}$. A second terminal of switch 47 is connected to the negative input of operational amplifier 44. An integrating feedback capacitor 48 has a first electrode connected to the negative input of operational amplifier 44 and a second electrode connected to both an output of operational amplifier 44 and a gate of transistor 20. Switches 37, 40 and 45 each have an N conductivity type control electrode connected to control signal $\phi$ and are made conductive by control signal $\phi$ being at a high logic level. Switches 38, 41 and 47 each have an N conductivity type control electrode connected to the control signal $\bar{\phi}$ and are made conductive by control signal $\bar{\phi}$ being at a high logic level.

Integrator portion 15 comprises an operational amplifier 50 having a negative or inverting input connected to the second terminals of switches 18 and 21. A positive input of operational amplifier 50 is connected to reference voltage $V_{AG}$. An integrating feedback capacitor 51 has a first electrode connected to the negative input of operational amplifier 50 and a second electrode connected to an output of operational amplifier 50 which is connected to output terminal 32.

Figure 2A:
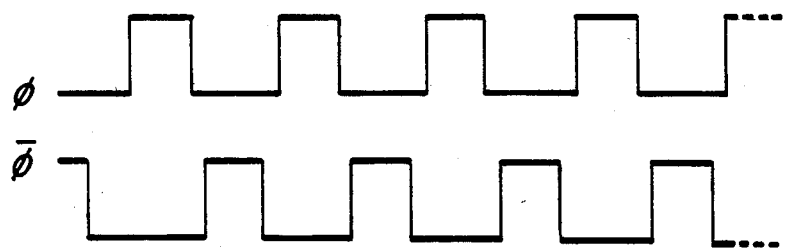
FIG. 2(a) illustrates in graphical form control signals for use with the generator circuit of FIG. 1.
Figure 2B:
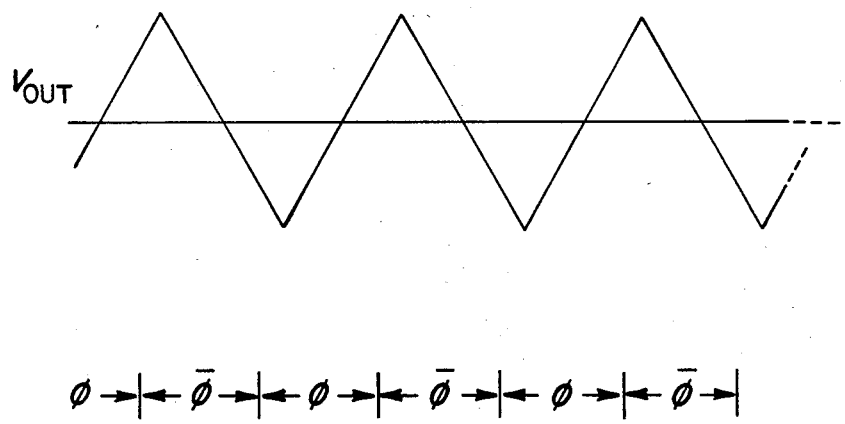
FIG. 2(b) illustrates in graphical form an output signal of the generator circuit of FIG. 1.

In operation, control signal $\phi$ shown in FIG. 2(a) transitions between low and high logic states at a predetermined frequency. The triangular waveform output signal shown in FIG. 2(b) is provided by alternately switching first and second current sources 11 and 12 to integrator portion 15 in response to control signal $\phi$. The frequency of the output signal $V_{OUT}$ is determined exclusively by control signal $\phi$ and the amplitude of output signal $V_{OUT}$ is accurately determined by the positive and negative reference voltages. The value of current which is sourced by transistor 17 is controlled by the voltage supplied by first control portion 13 which functions as a switched capacitor feedback loop between output 32 and the negative input of operational amplifier 50 of integrator portion 15. Similarly, the value of current which is sourced by transistor 20 is controlled by the voltage supplied by second control portion 14 which also functions as a switched capacitor feedback loop between output 32 and the negative input of operational amplifier 50. The positive peak of output voltage $V_{OUT}$ is periodically sampled and stored onto capacitor 46 when control signal $\phi$ is in a high logic state. Simultaneously, a precise positive reference voltage is sampled and stored onto capacitor 39. When control signal $\phi$ transitions to a low logic level and control signal $\bar{\phi}$ transitions to a high logic level, switches 45 and 37 become nonconductive and switches 38, 41 and 47 become conductive thereby coupling the charge of capacitors 46 and 39 to operational amplifier 44. Any difference between the charges on capacitors 46 and 39 is integrated by capacitor 48 to provide a voltage $V_2$ at the output of operational amplifier 44 which varies in proportion to the difference between $V_{OUT}$ and $+V_{REF}$ in the following manner:

$$\Delta V_2 = (C46/C48)(-V_{OUT}) + (+V_{ref})(C39/C48)$$

where C46, C48 and C39 are the capacitive values of capacitors 46, 48 and 39, respectively. Assume for the purpose of illustration only that the capacitors are ratioed so that $\Delta V_2$ is equal to the difference between $V_{OUT}$ and $+V_{REF}$. Therefore, $\Delta V_2$ will be greater than zero unless $V_{OUT}$ has reached $+V_{REF}$ during the previous high level of control signal $\phi$. When $V_{OUT}$ is substantially less than $+V_{REF}$, voltage $V_2$ is increased by $\Delta V_2$ until transistor 20 provides enough current so that output voltage $V_{OUT}$ reaches $+V_{REF}$ by the end of the $\phi$ control signal period. Assume that control signal $\phi$ transitions to a high logic level so that switch 21 couples transistor 20 to the negative input of operational amplifier 50. During this time, first voltage controlled current source 11 and first control portion 13 are totally disconnected from operational amplifier 50. Simultaneously, transistor 17 is conductive and couples current from the positive $V_{DD}$ power supply to reference voltage $V_{AG}$ via switch 19. When switch 21 is conductive, current is sinked from the negative input of operational amplifier 50 to the negative supply voltage $V_{SS}$. Transistor 20 remains conductive constantly and has a current electrode which is switched between the negative input of operational amplifier 50 and reference voltage $V_{AG}$. The voltage at the negative input of operational amplifier 50 remains substantially constant and the output voltage varies from peak-to-peak to maintain substantially equal voltages at the input of operational amplifier 50. During the high logic level period of clock signal $\phi$ when current is sinked from the negative input of operational amplifier 50, the charge on capacitor 51 increases to maintain the substantially equal input voltages. As a result, output voltage $V_{OUT}$ increases linearly with the increased charging of capacitor 51 until $V_{OUT}$ reaches $+V_{REF}$ as shown in FIG. 2(b). The slope of the triangular waveform is determined by the value of the reference voltage and the frequency of the control signal so that the output signal will reach $+V_{REF}$ by the end of a single clock period.

When clock signal $\phi$ transitions to a low logic level, switch 21 disconnects second voltage controlled current source 12 from integrator portion 15. Simultaneously, first voltage controlled current source 11 is coupled to integrator portion 15. During the previous low and high logic levels of clock signal $\phi$, both the negative peak of voltage $V_{OUT}$ and a precise negative reference voltage, $(-V_{REF})$, is sampled and stored. This is accomplished by sampling and storing the precise negative reference voltage onto capacitor 25 and sampling and storing the negative peak of output voltage $V_{OUT}$ onto capacitor 33. When control signal $\phi$ transitions to a high logic level, switches 26, 28 and 34 become conductive thereby coupling the charge of capacitors 25 and 33 to operational amplifier 30. Any difference between the charges on capacitors 25 and 33 is integrated by capacitor 35 to provide a voltage $V_1$ at the output of operational amplifier 30 which is proportional to the difference between $V_{OUT}$ and $-V_{REF}$ in the following manner:

$$\Delta V_1 = (C33/C35)(-V_{OUT}) + (-V_{REF})(C25/C35)$$

where C33, C35 and C25 are the capacitive values of capacitors 33, 35 and 25, respectively. Assume for the purpose of illustration only that the capacitors are ratioed so that $\Delta V_1$ is equal to the difference between $V_{OUT}$ and $-V_{REF}$. Therefore, the differential voltage, $\Delta V_1$, will be less than zero unless $V_{OUT}$ has reached $-V_{REF}$ during the previous low state of clock signal $\phi$. When $V_{OUT}$ is substantially less than $V_{REF}$ in absolute magnitude, $V_1$ is decreased by $\Delta V_1$ until transistor 17 provides enough current so that $V_{OUT}$ reaches $-V_{REF}$ by the end of the clock signal $\phi$ period. Therefore, current from positive supply voltage $V_{DD}$ is sourced to the negative input of operational amplifier 50 which causes the output of operational amplifier 50 to transition to the negative reference voltage. The output voltage $V_{OUT}$ will linearly decrease during the period when $\phi$ is at a low level due to the resulting charge across capacitor 51. When clock signal $\phi$ transitions back to a logic high level, switch 18 disconnects first voltage controlled current source 11 from operational amplifier 50 and the circuit operation repeats as described above to provide a precise triangular waveform output. Transistor 17 remains conductive constantly and has a current electrode which is switched between the negative input of operational amplifier 50 and reference voltage $V_{AG}$. Since transistors 17 and 20 remain conductive constantly, a smooth transition occurs between the switching of first and second voltage controlled current sources 11 and 12.

By now it should be apparent that a triangular waveform having precise edges has been provided by utilizing only a precise voltage reference. Since the necessity for a precision current source has been eliminated, no precise components are required. Therefore, no components external to an intergated circuit are required. The accuracy of triangle generator circuit 10 is independent of the value of capacitors 51, 35 or 48. Loop stability of a first loop comprising control portion 13 and integrator portion 15 and a second loop comprising control portion 14 and integrator portion 15 is dependent upon only the transconductance of transistors 17 and 20 and upon capacitor ratios. The capacitors can be accurately matched in conventional electronic processes. Conventional transconductance amplifiers may replace transistors 17 and 20 to improve stability and power supply rejection. Offset voltages which are associated with operational amplifiers 30, 44 and 50 are automatically zeroed by virtue of the loop structure of triangle waveform generator 10.

Figure 3:
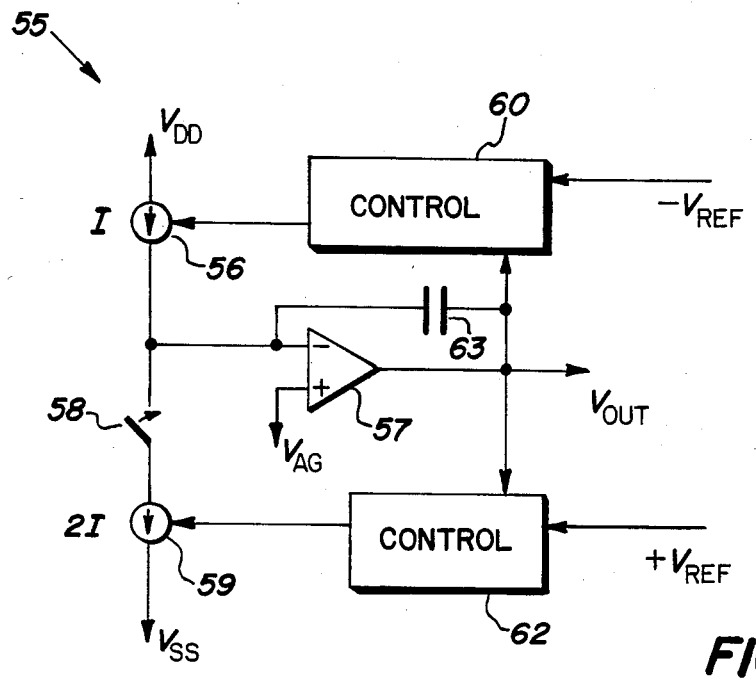
FIG. 3 illustrates in block diagram form a second embodiment of the present invention.

Shown in FIG. 3 is a second form of the present invention utilizing in which a triangle waveform generator 55 comprises a first voltage controlled current source 56 connected between a supply voltage $V_{DD}$ and a negative input of an operational amplifier 57. A single switch 58 has a first terminal connected to the negative input of operational amplifier 57. A second voltage controlled current source 59 is connected between a second terminal of switch 58 and a supply voltage $V_{SS}$. Operational amplifier 57 has a positive input connected to a reference voltage $V_{AG}$ and an output for providing a triangular shaped output voltage $V_{OUT}$. A control circuit 60 has a first input connected to an output of operational amplifier 57 and a second input connected to a positive reference voltage $+V_{REF}$. An output of control circuit 60 is connected to a control input of current source 56. A control circuit 62 has a first input connected to the output of operational amplifier 57, a second input connected to a negative reference voltage $-V_{REF}$ and an output connected to a control input of current source 59. A feedback capacitor 63 has a first electrode connected to the negative input of operational amplifier 57 and a second electrode connected to the output of operational amplifier 57.

Although triangle waveform generator 55 functions in a manner analogous to triangle generator circuit 10, only a single switch, switch 58, is required to alternately switch current sources 56 and 59. This is accomplished by making current sources 56 and 59 conduct differing amounts of current. In the illustrated form, current source 56 conducts a current of I and current source 59 conducts a current of 2I. Control circuit 60 is analogous in operation to first control portion 13 of FIG. 1 and control circuit 62 is analogous in operation to second control portion 14 of FIG. 1.

Figure 4:
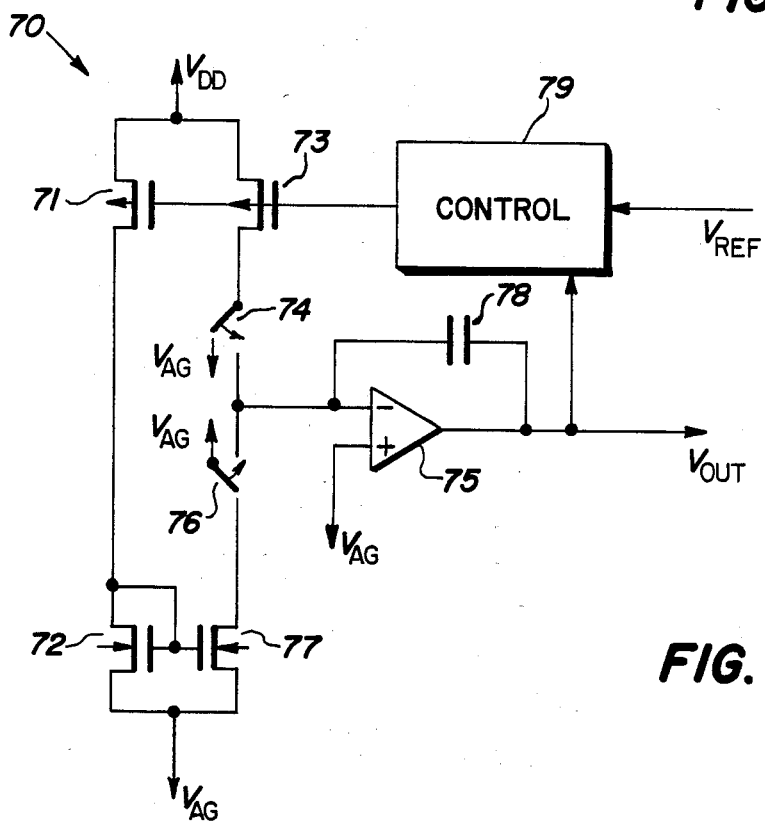
FIG. 4 illustrates in partial schematic form another embodiment of the present invention.

Shown in FIG. 4 is yet another form of the present invention in which only a single control feedback loop is utilized. A triangle waveform generator circuit 70 comprises a P-channel transistor 71 having a source connected to a supply voltage $V_{DD}$, a control and a drain electrode. An N-channel transistor 72 has a drain connected to both a control thereof and to the drain electrode of transistor 71. A source of transistor 72 is connected to reference voltage $V_{AG}$. A P-channel transistor 73 has a source connected to supply voltage $V_{DD}$, a control, and a drain electrode connected to a first terminal of a switch 74. A second terminal of switch 74 is alternately connected between reference voltage $V_{AG}$ and a negative input of an operational amplifier 75. A positive input of operational amplifier 75 is connected to reference voltage $V_{AG}$. A switch 76 has a first terminal connected to reference voltage $V_{AG}$ and a second terminal which is alternately connected between a drain of an N-channel transistor 77 and the negative input of operational amplifier 75. A control electrode of transistor 77 is connected to a control electrode of transistor 72, and a source of transistor 77 is connected to reference voltage $V_{AG}$. A feedback capacitor 78 has a first electrode connected to the negative input of operational amplifier 75 and a second electrode connected to an output of operational amplifier 75 for providing an output voltage $V_{OUT}$. A control circuit 79 has a first input connected to the output of operational amplifier 75, a second input connected to a reference voltage and an output connected to the control electrodes of transistors 71 and 73.

In operation, triangle waveform generator 70 is analogous to waveform generator 10 with the exception that transistors 71, 72, 73 and 77 eliminate the need for two feedback control loops. By utilizing a current mirroring technique, the physical dimensions of transistors 72 and 77 may be ratioed to establish a current through transistor 77 which is proportional to the current conducted by transistor 73. As a result, current may be either sourced or sinked from the negative input of operational amplifier 75 in response to control circuit 79 and the switching of switches 74 and 76. Therefore, the present invention may be practiced by using only one feedback loop.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A precision triangle waveform generator for providing a triangular output signal of predetermined frequency having precise valued peaks, comprising:
   a first transistor having a first current electrode coupled to a terminal for receiving a positive supply voltage, a control electrode, and a second current electrode;
   first switching means for alternately connecting the second current electrode of the first transistor between a first reference voltage and an input node;
   a second transistor having a first current electrode connected to a terminal for receiving a negative supply voltage, a control electrode, and a second current electrode;
   second switching means for alternately connecting the second current electrode of the second transistor to the first reference voltage and to the input node;
   control means coupled to the control electrodes of the first and second transistors for controlling the first and second transistors in response to both a second reference voltage and the output signal; and
   integrating amplifier means having an input connected to the input node, and an output for providing the triangular output signal having positive and negative peaks proportional to the reference voltage.

2. The precision triangle waveform generator of claim 1 wherein said integrating amplifier comprises:
   an operational amplifier having a positive input connected to the first reference voltage, a negative input connected to the input node, and an output for providing the triangular output signal; and
   an integrating feedback capacitor having a first electrode connected to the negative input of the operational amplifier, and a second electrode connected to the output of the operational amplifier.

3. The precision triangle waveform generator of claim 1 wherein said control means comprise:
   first control means for providing a first control voltage to the control electrode of the first transistor which is proportional to the difference between a negative value of the second reference voltage and a negative peak value of the output signal; and
   second control means for providing a second control voltage to the control electrode of the second transistor which is proportional to the difference between a positive value of the second reference voltage and a positive peak value of the output signal.

4. The precision triangle waveform generator of claim 3 wherein said first control means comprise:
   a first capacitor;
   a second capacitor;
   an operational amplifier having a positive input connected to the first reference voltage, a negative input and an output;
   a third capacitor having a first electrode connected to the negative input of the operational amplifier, and a second electrode connected to the output of the operational amplifier;
   third switching means for selectively charging said first capacitor to the negative value of the second reference voltage and coupling a resulting charge to the negative input of the operational amplifier; and
   fourth switching means for selectively charging said second capacitor to the negative peak value of the output signal and coupling a resulting charge to the negative input of the operational amplifier.

5. The precision triangle waveform generator of claim 4 wherein said second control means comprise:
   a fourth capacitor;
   a fifth capacitor;
   a second operational amplifier having a positive input connected to the first reference voltage, a negative input and an output;
   a sixth capacitor having a first electrode connected to the negative input of the operational amplifier, and a second electrode connected to the output of the second operational amplifier;
   fifth switching means for selectively charging said fourth capacitor to the positive value of the second reference voltage and coupling a resulting charge to the negative input of the operational amplifier; and
   sixth switching means for selectively charging said fifth capacitor to the positive peak value of the output signal and coupling a resulting charge to the negative input of the operational amplifier.

6. A method for providing a triangular waveform having a precise positive peak value and a precise negative peak value, comprising the steps of:
   selectively charging a first capacitor to a first reference voltage;
   selectively charging a second capacitor to the negative peak value of the triangular waveform;
   integrating a charge difference between said first and second capacitors to provide a first control voltage;
   selectively charging a third capacitor to a second reference voltage;
   selectively charging a fourth capacitor to the positive peak value of the triangular waveform;
   integrating a charge difference between said third and fourth capacitors to provide a second control voltage;
   coupling said first control voltage to a first voltage controlled current source;

coupling said second control voltage to a second voltage controlled current source; and alternately coupling said first and second current sources to an integrating amplifier for providing the triangular waveform, wherein said first and second current sources compensate said output waveform in response to the positive and negative peak values differing from a predetermined proportion of said first and second reference voltages, respectively.

7. A method for providing a triangular waveform having a precise positive peak value and a precise negative peak value, comprising the steps of:

selectively charging a first capacitor to a reference voltage;

selectively charging a second capacitor to a peak value of the triangular waveform;

integrating a charge difference between said first and second capacitors to provide a control voltage;

coupling said control voltage to a voltage controlled current source; and alternately coupling the voltage controlled current source and a second current source to an integrating amplifier for providing the triangular waveform, wherein said first and second current sources compensate said output waveform in response to the peak values differing from a predetermined proportion of said reference voltage.

8. A function generator for providing an output signal at a predetermined frequency and having a precise positive and negative peak value, comprising:

switched voltage controlled current source means for alternately providing a source current and a sink current in response to first and second control voltages, respectively;

first control means for providing the first control voltage, said first control means having a first integrating operational amplifier for selectively integrating the difference between the positive peak value of the output signal and a positive reference voltage;

second control means for providing the second control voltage, said second control means having a second integrating operational amplifier for selectively integrating the difference between the negative peak value of the output signal and a negative reference voltage; and integrating amplifier means having an input coupled to said switched voltage controlled current source means, and an output for providing the output signal.

9. The function generator of claim 8 wherein said first control means further comprise:

a first capacitor for selectively charging the positive reference voltage;

a second capacitor for selectively charging the positive peak value of the output signal; and switching means for selectively coupling the first and second capacitors to the first operational amplifier.

10. The function generator of claim 9 wherein said second control means further comprise:

a third capacitor for selectively charging the negative reference voltage;

a fourth capacitor for selectively charging the negative peak value of the output signal; and second switching means for selectively coupling the third and fourth capacitors to the second operational amplifier.

11. The function generator of claim 8 wherein said integrating amplifier means further comprise:

a third operational amplifier having a negative input coupled to the switched voltage controlled current source means, a positive input coupled to a ground reference voltage, and an output for providing the output signal; and an integrating capacitor having a first electrode connected to the negative input of the third operational amplifier, and a second electrode connected to the output of the third operational amplifier.

12. The function generator of claim 8 wherein said switched voltage controlled current source means comprise:

a first transistor of a first conductivity type having a first current electrode connected to a first supply voltage, a control electrode connected to the first control voltage, and a second current electrode;

a second transistor of a second conductivity type having a first current electrode connected to a second supply voltage, a control electrode connected to the second control voltage, and a second current electrode; and switching means for alternately coupling the second current electrodes of the first and second transistors to the input of the integrating amplifier means at the predetermined frequency.

* * * * *